United States Patent [19]

Lee

[11] Patent Number: 5,175,120
[45] Date of Patent: Dec. 29, 1992

[54] METHOD OF PROCESSING A SEMICONDUCTOR WAFER TO FORM AN ARRAY OF NONVOLATILE MEMORY DEVICES EMPLOYING FLOATING GATE TRANSISTORS AND PERIPHERAL AREA HAVING CMOS TRANSISTORS

[75] Inventor: Roger R. Lee, Boise, Id.

[73] Assignee: Micron Technology, Inc., Boise, Id.

[21] Appl. No.: 776,073

[22] Filed: Oct. 11, 1991

[51] Int. Cl.⁵ .................... H01L 21/265; H01L 21/70
[52] U.S. Cl. ...................................... 437/48; 437/51; 437/52; 437/56
[58] Field of Search ...................... 357/23.5; 365/185; 437/43, 48, 52, 56

[56] References Cited

U.S. PATENT DOCUMENTS

| 4,918,501 | 4/1990 | Komori et al. | 357/23.5 |
| 5,005,066 | 4/1991 | Chen | 357/23.5 |
| 5,023,190 | 6/1991 | Lee et al. | 437/41 |
| 5,057,448 | 11/1991 | Kuroda | 437/52 |

FOREIGN PATENT DOCUMENTS

| 0257373 | 10/1989 | Japan | 437/52 |
| 0082581 | 3/1990 | Japan | 437/43 |

Primary Examiner—Olik Chaudhuri
Assistant Examiner—Loc Q. Trinh
Attorney, Agent, or Firm—Wells, St. John & Roberts

[57] ABSTRACT

Disclosed is a process for fabricating a semiconductor wafer to form a memory array and peripheral area, where the array comprises nonvolatile memory devices employing floating gate transistors and the peripheral area comprises CMOS transistors. A first layer of conductive material is applied atop insulating layers. A dielectric layer is applied atop the first conductive layer for use in floating gate transistors within the array. The dielectric layer and first conductive material are etched from the peripheral area, leaving patterned dielectric material and first conductive material in the array. A second layer of conductive material is applied atop the wafer to cover the peripheral area and dielectric layer of the array. The conductive and dielectric materials of the array are patterned and etched separately from the patterning and etching of conductive material of each of the first and second conductivity type CMOS transistors of the peripheral area. As well, the conductive material of the first conductivity type CMOS transistors of the peripheral area are patterned and etched separately from the patterning and etching of each of, a) conductive and dielectric materials of the array, and b) conductive material of the second conductivity type CMOS transistors of the peripheral area. Further, the conductive material of the second conductivity type CMOS transistors of the peripheral area are patterned and etched separately from patterning and etching of each of, a) conductive and dielectric materials of the array, and b) conductive material of the first conductivity type CMOS transistors of the peripheral area.

28 Claims, 12 Drawing Sheets

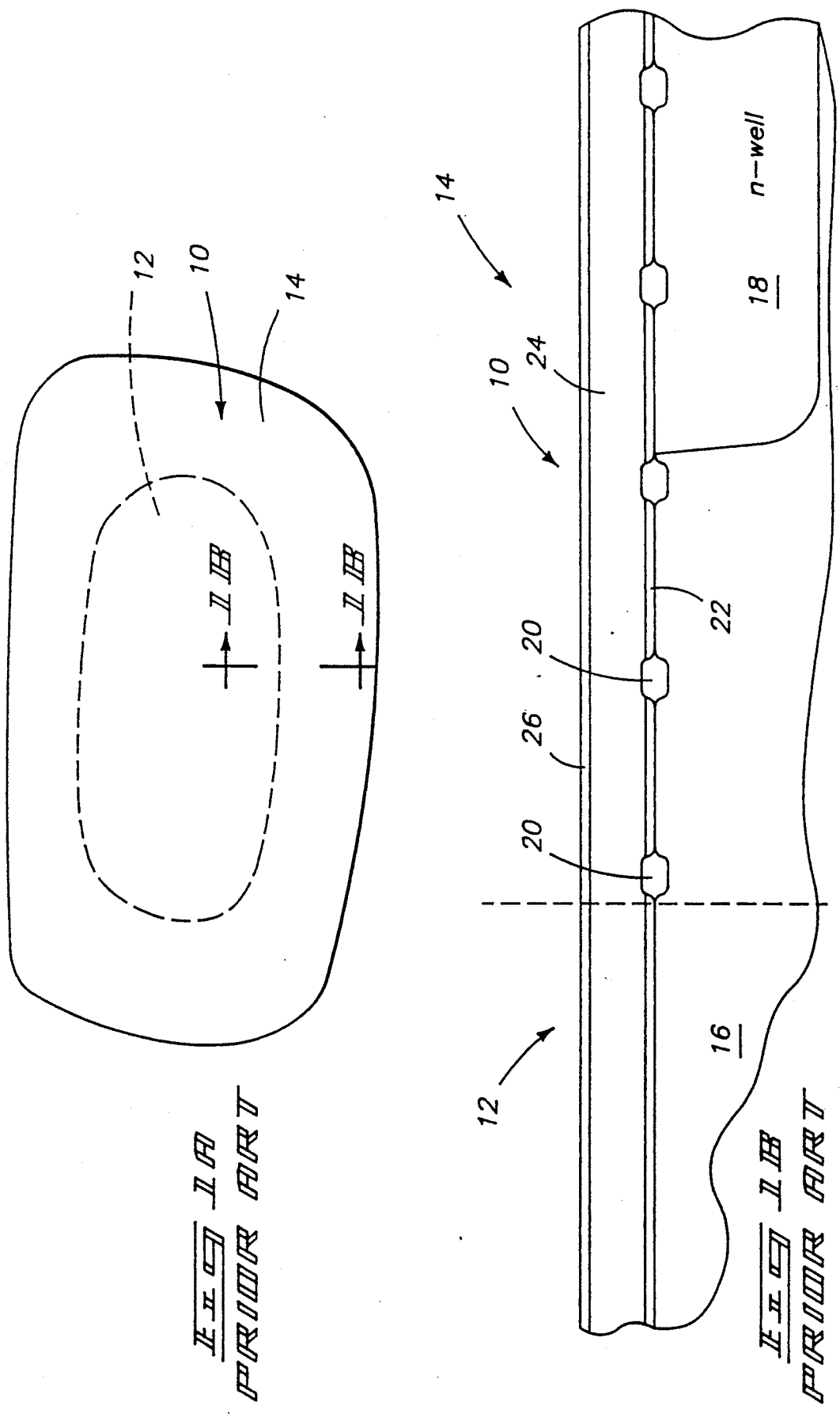

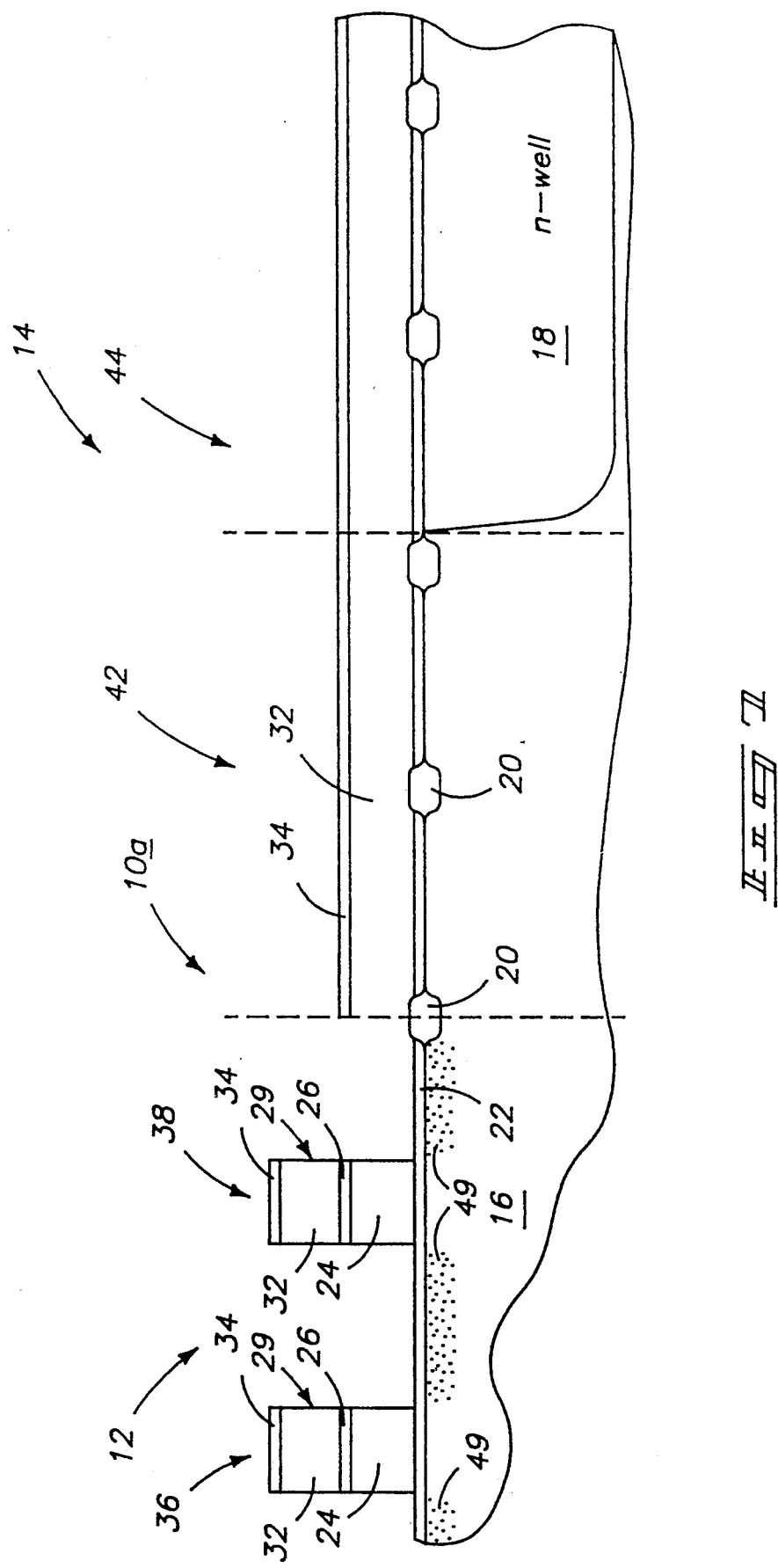

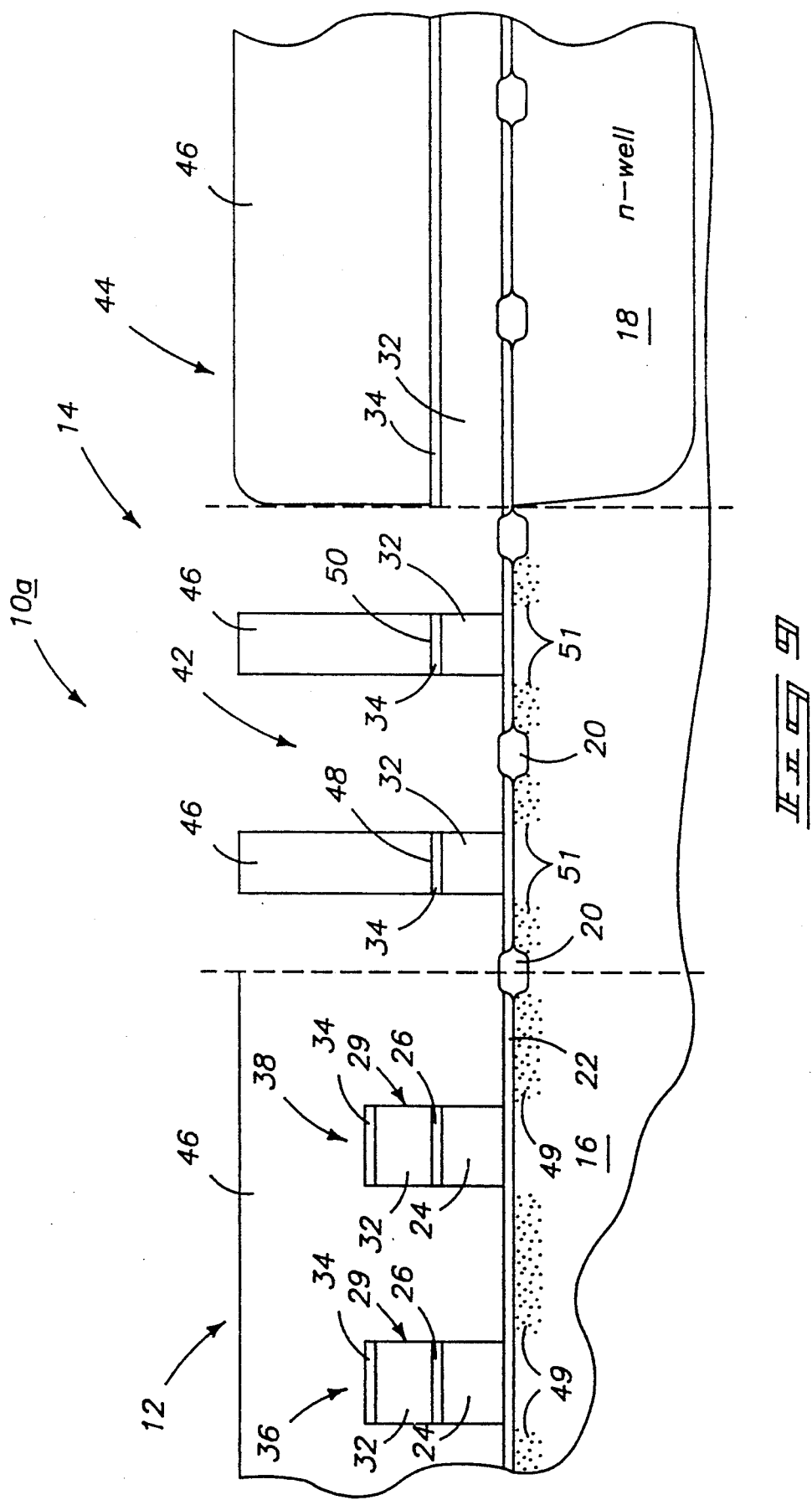

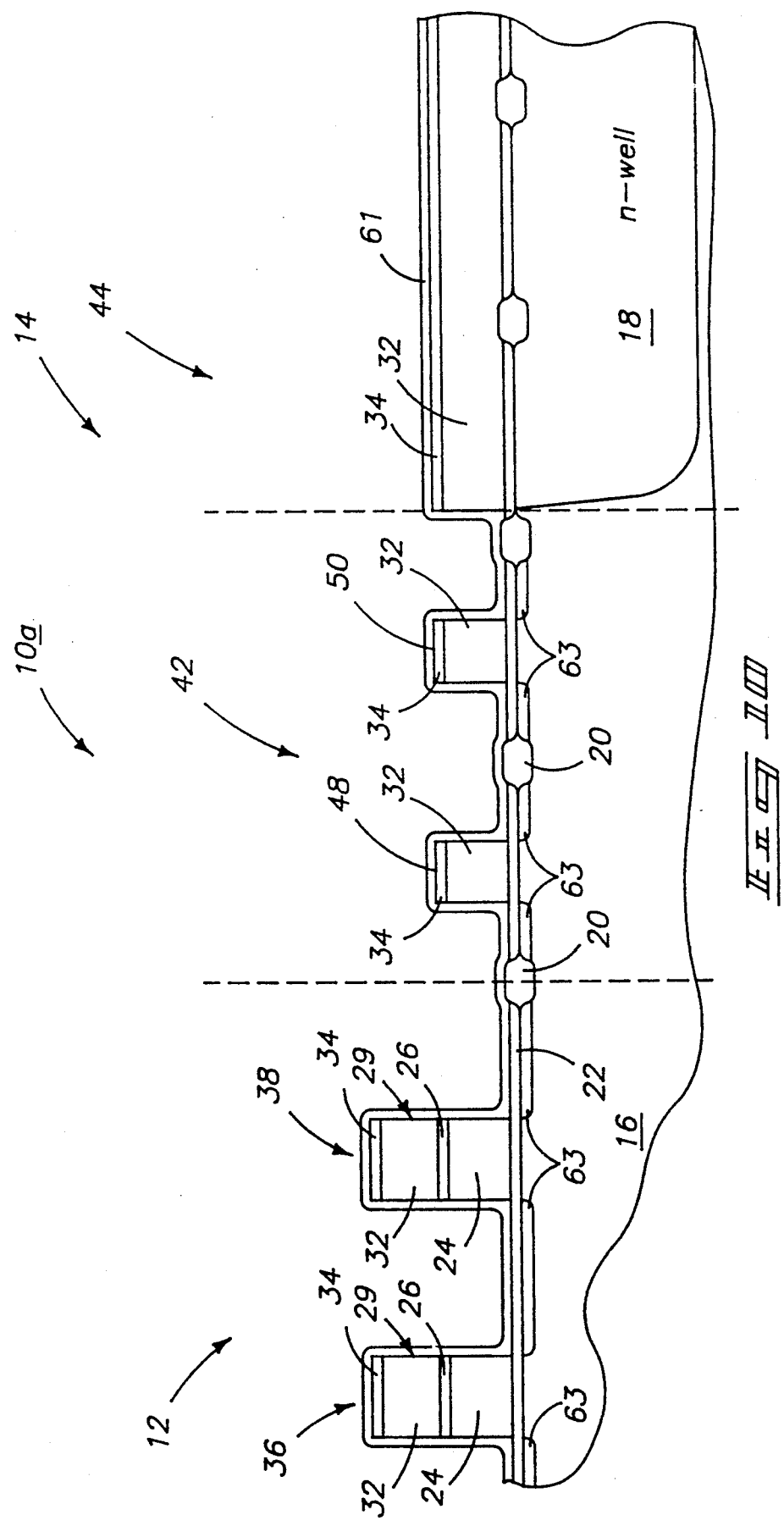

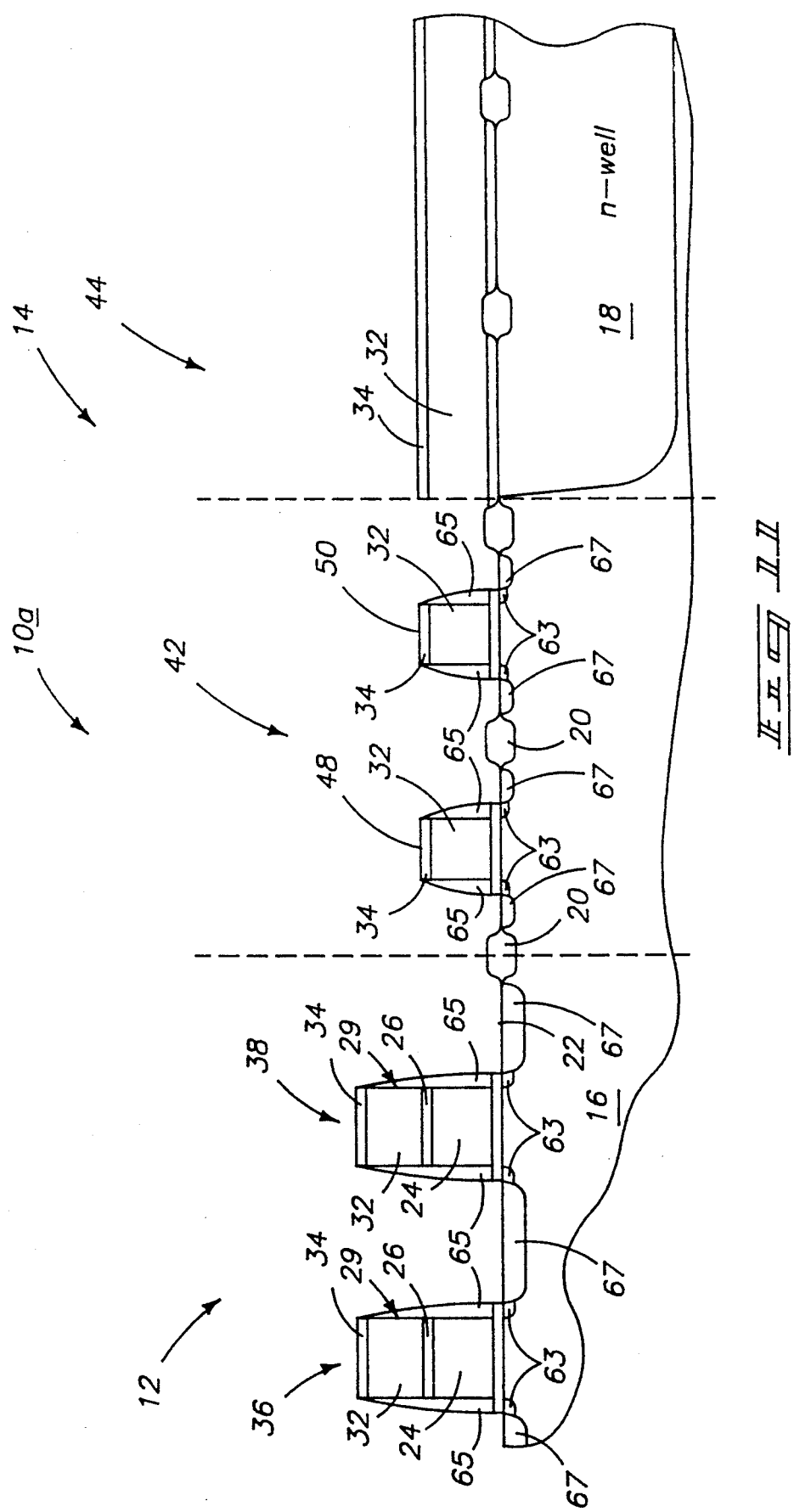

METHOD OF PROCESSING A SEMICONDUCTOR WAFER TO FORM AN ARRAY OF NONVOLATILE MEMORY DEVICES EMPLOYING FLOATING GATE TRANSISTORS AND PERIPHERAL AREA HAVING CMOS TRANSISTORS

TECHNICAL FIELD

This invention relates generally to fabrication of semiconductor wafers to form memory arrays and areas peripheral to the array, with the arrays comprising non-volatile memory devices employing floating gate transistors. More particularly, the invention concerns fabrication of EPROM and EEPROM memory arrays.

BACKGROUND OF THE INVENTION

Read-only-memories (ROMs) are memories into which information is permanently stored during fabrication. Such memories are considered "non-volatile" as only read operations can be performed.

Each bit of information in a ROM is stored by the presence or absence of a data path from the word (access) line to a bit (sense) line. The data path is eliminated simply by insuring no circuit element joins a word and bit line. Thus, when the word line of a ROM is activated, the presence of a signal on the bit line will mean that a 1 is stored, whereas the absence of a signal indicates that a 0 is stored.

If only a small number of ROM circuits are needed for a specific application, custom mask fabrication might be too expensive or time consuming. In such cases, it would be faster and cheaper for users to program each ROM chip individually. ROMs with such capabilities are referred to as programmable read-only-memories (PROMs). In the first PROMs which were developed, information could only be programmed once into the construction and then could not be erased. In such PROMs, a data path exists between every word and bit line at the completion of the chip manufacture. This corresponds to a stored 1 in every data position. Storage cells during fabrication were selectively altered to store a 0 following manufacture by electrically severing the word-to-bit connection paths. Since the write operation was destructive, once the 0 had been programmed into a bit location it could not be erased back to a 1. PROMs were initially implemented in bipolar technology, although MOS PROMs became available.

Later work with PROMs led to development of erasable PROMs. Erasable PROMs depend on the long-term retention of electric charge as the means for information storage. Such charge is stored on a MOS device referred to as a floating polysilicon gate. Such a construction differs slightly from a conventional MOS transistor gate. The conventional MOS transistor gate of a memory cell employs a continuous polysilicon word line connected among several MOS transistors which functions as the respective transistor gates. The floating polysilicon gate of an erasable PROM interposes a localized secondary polysilicon gate in between the continuous word line and silicon substrate into which the active areas of the MOS transistors are formed. The floating gate is localized in that the floating gates for respective MOS transistors are electrically isolated from the floating gates of other MOS transistors.

Various mechanisms have been implemented to transfer and remove charge from a floating gate. One type of erasable programmable memory is the so-called electrically programmable ROM (EPROM). The charge-transfer mechanism occurs by the injection of electrons into the floating polysilicon gate of selected transistors. If a sufficiently high reverse-bias voltage is applied to the transistor drain being programmed, the drain-substrate "pn" junction will experience "avalanche" breakdown, causing hot electrons to be generated. Some of these will have enough energy to pass over the insulating oxide material surrounding each floating gate and thereby charge the floating gate. These EPROM devices are thus called floating-gate, avalanche-injection MOS transistors (FAMOS). Once these electrons are transferred to the floating gate, they are trapped there. The potential-barrier at the oxide-silicon interface of the gate is greater than 3 eV, making the rate of spontaneous emission of the electrons from the oxide over the barrier negligibly small. Accordingly, the electronic charge stored on the floating gate can be retained for many years.

When the floating gate is charged with a sufficient number of electrons, inversion of the channel under the gate occurs. A continuously conducting channel is thereby formed between the source and drain exactly as if an external gate voltage had been applied. The presence of a 1 or 0 in each bit location is therefore determined by the presence or absence of a conducting floating channel gate in each program device.

Such a construction also enables means for removing the stored electrons from the floating gate, thereby making the PROM erasable. This is accomplished by flood exposure of the EPROM with strong ultraviolet light for approximately 20 minutes. The ultraviolet light creates electron-hole pairs in the silicon dioxide, providing a discharge path for the charge (electrons) from the floating gates.

In some applications, it is desirable to erase the contents of a ROM electrically, rather than to use an ultraviolet light source. In other circumstances, it would be desirable to be able to change one bit at a time, without having to erase the entire integrated circuit. Such led to the development of electrically erasable PROMs (EEPROMs). Such technologies include MNOS transistors, floating-gate tunnel oxide MOS transistors (FLOTOX), textured high-polysilicon floating-gate MOS transistors, and flash EEPROMs. Such technologies can include a combination of floating gate transistor memory cells within an array of such cells, and a peripheral area to the array which comprises CMOS transistors.

With floating gate transistors, the floating gate polysilicon (commonly referred to as Poly 1) is positioned in between the overlying word line polysilicon (commonly referred to as Poly 2) and underlying substrate. Two edges of the floating gate poly are lined up directly relative to the word line edge. This factor would make the photo and etch process very difficult if one were to try to completely define the floating gate poly first, and then pattern the word line. This would be due to the problems of photomask misalignment and photo-edge etch effect.

One approach of avoiding the problem is to first define only two edges (instead of all four edges) of the floating gate. The typical two edges patterned first are the Poly 1 floating gate edges which do not coincide with the word line edges. With this completed, a stack poly etch for the word lines during the Poly 2 etch (word line) patterning defines the word line edges as well as the remaining two edges of the floating gate. This approach is not sensitive to any misalignment due to the fact that the word line and corresponding floating gate edges "self-align" relative to each other during the same etching process.

Prior art techniques of processing erasable PROMs are described with reference to FIGS. 1A-5. FIG. 1A is a top view of a wafer fragment at one processing step, with FIG. 1B being an enlarged cross section taken through line 1B—1B of FIG. 1 during the same step. In each of the figures which follow, the "A" figure represents a top view, while the "B" view represents an enlarged cross sectional view at the same step in the described process. FIGS. 1A and 1B illustrate a wafer fragment 10 which will be defined by a memory array area 12 and an area 14 peripheral to array area 12. Wafer fragment 10 is comprised of a bulk substrate 16, which in the described embodiment is p-type, with peripheral area 14 being provided with n-well 18 for formation of CMOS transistors in the peripheral area 14. Field oxide regions 20 and a gate insulating layer 22 are provided atop substrate 16. A first layer 24 of polysilicon (Poly 1) is applied atop insulating layers 20 and 22. A tri-layer 26 of dielectric is applied atop first polysilicon layer 24 for use in floating gate transistors to be formed within array area 12. Tri-layer 26 typically comprises an O—N—O sandwich construction.

Referring to FIGS. 2A and 2B, dielectric layer 26 and polysilicon layer 24 are etched away from peripheral area 14, and etched within array 12 to define lines 28. Lines 28 are defined by opposing edges 30a and 30b which will form the first two edges of the floating gate transistors within array 12, as will be apparent from the continuing discussion.

Referring to FIGS. 3A and 3B, a second polysilicon layer 32 is applied atop the wafer to cover peripheral area 14 and array area 12. As well, a thin higher conductive layer 34, such as WSi$_x$, is applied atop poly layer 32. Collectively, layers 32 and 34 are considered as the Poly 2 layer.

Referring to FIGS. 4A and 4B, a layer of photoresist (not shown) is applied and patterned as illustrated to define FAMOS transistor gates 36, 38 within array area 12, and coincident word lines 29 as shown. It is necessary that peripheral area 14 be masked with photoresist during such etch to prevent trenching into substrate 16.

Referring to FIG. 5, prior art processes next pattern peripheral area 14 to form each of the word line transistor gates 35, 37, 39 and 41 in the same step. (Word lines 35, 37, 39 and 41 are not shown in the "A" figures.) Thereafter, separate photoresist masks must be applied and patterned to enable implanting of the various p and n type dopant materials required adjacent illustrated transistor gates 36, 38, 35, 37, 39 and 41. Spacers as well are formed to produce the configuration shown in FIG. 6. The prior art process from FIG. 5 to produce the construction of FIG. 6 proceeds as follows.

Photoresist is applied and patterned to mask the n-well. A punch-through boron (p-type material) implant is then conducted (typical dose of $5 \times 10^{12}$ atoms/cm$^2$) into each of the unmasked n-channel transistor regions of the array and peripheral area. A conformal layer of oxide, such as TEOS, of approximately 1000 Angstroms thickness is applied atop the wafer. Photoresist is then again applied and patterned to mask the n-well. Phosphorus (n-type material) is then implanted (typical dose of $5 \times 10^{13}$ atoms/cm$^2$) to form LDD regions 11. The photoresist is then removed, and oxide layer is applied and anisotropically etched to form spacers 13. Photoresist is then reapplied and patterned to mask the n-well.

Arsenic (n-type material) is then implanted (typical dose of $5 \times 10^{15}$ atoms/cm$^2$) to form n+ source and drain regions 15. The photoresist is then removed, and then reapplied and patterned to mask everything but the n-well. Boron (p-type material) is then implanted (typical dose of $5 \times 10^{15}$ atoms/cm$^2$) to form source and drain p+ regions 17, and then the photoresist removed.

Such results in high process complexity and numerous photomasks which increase the cost and time to process the wafers. For example from FIG. 3, six photomasks are required by the above process to effect all the desired implants. At least one more photomask would be required were it desirable to optimize or modify the n-channel implants of the array transistors differently from the peripheral n-channel transistors.

It would be desirable to improve upon this prior art method.

BRIEF DESCRIPTION OF THE DRAWINGS

Preferred embodiments of the invention are described below with reference to the accompanying drawings.

FIG. 1A is a top plan view of a semiconductor wafer fragment processed in accordance with prior art methods, and is described in the "Background" section above.

FIG. 1B is an enlarged cross sectional view of FIG. 1A taken through line 1B—1B in FIG. 1A.

FIG. 7 is a cross sectional view of a semiconductor wafer processed in accordance with the invention, and at a processing step subsequent to that illustrated by FIGS. 4A and 4B of the prior art process.

FIG. 9 is a cross sectional view of the FIG. 7 wafer at a processing step subsequent to that illustrated by FIG. 8.

FIG. 10 is a cross sectional view of the FIG. 7 wafer at a processing step subsequent to that illustrated by FIG. 9.

FIG. 11 is a cross sectional view of the FIG. 7 wafer at a processing step subsequent to that illustrated by FIG. 10.

DETAILED DESCRIPTION OF THE PREFERRED EMBODIMENTS

Figures 2A, 2B:
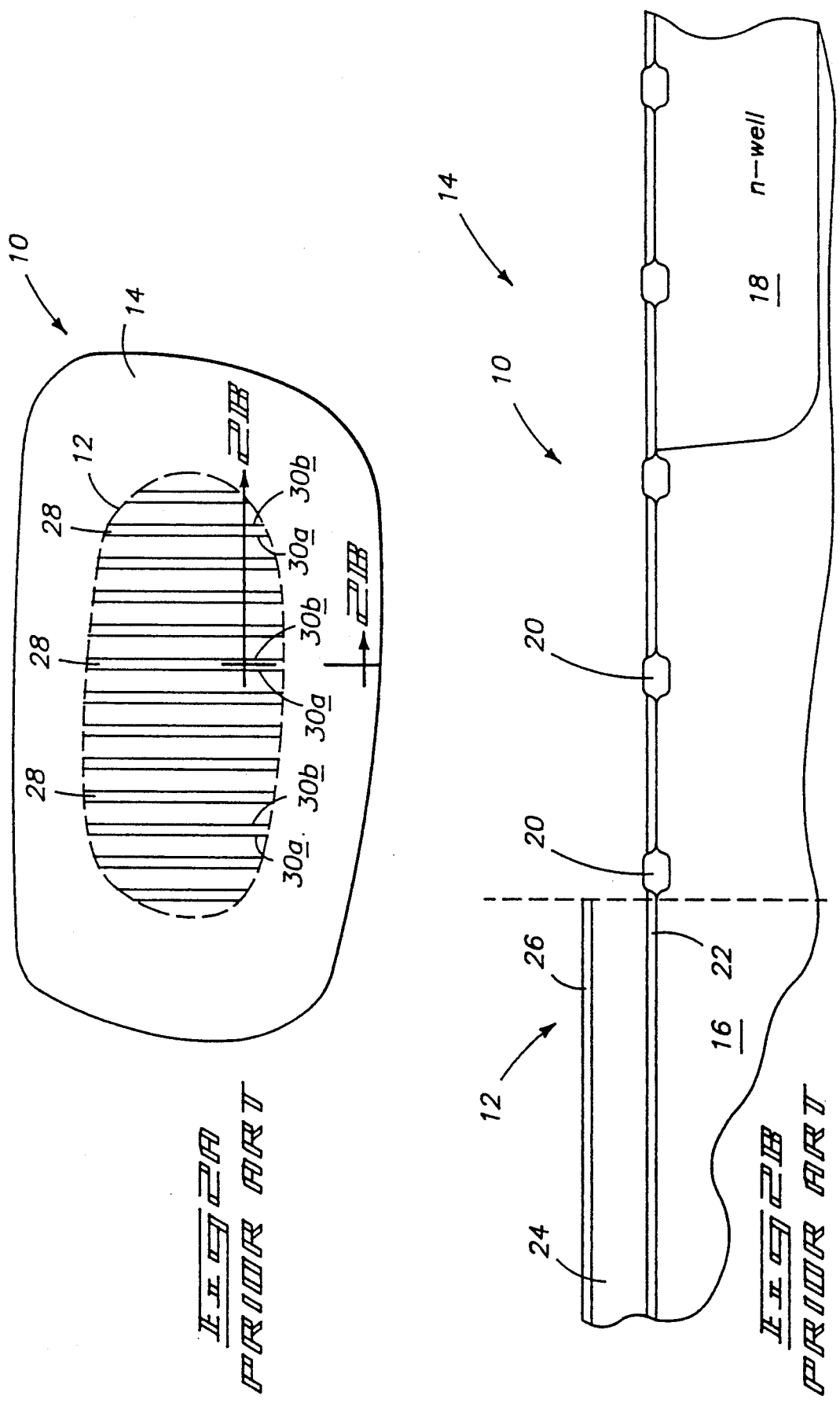
FIG. 2A is a top plan view of the FIG. 1A wafer fragment at a processing step subsequent to that illustrated by FIGS. 1A and 1B.
FIG. 2B is an enlarged cross sectional view of FIG. 2A taken through line 2B—2B of FIG. 2A.
Figures 3A, 3B:
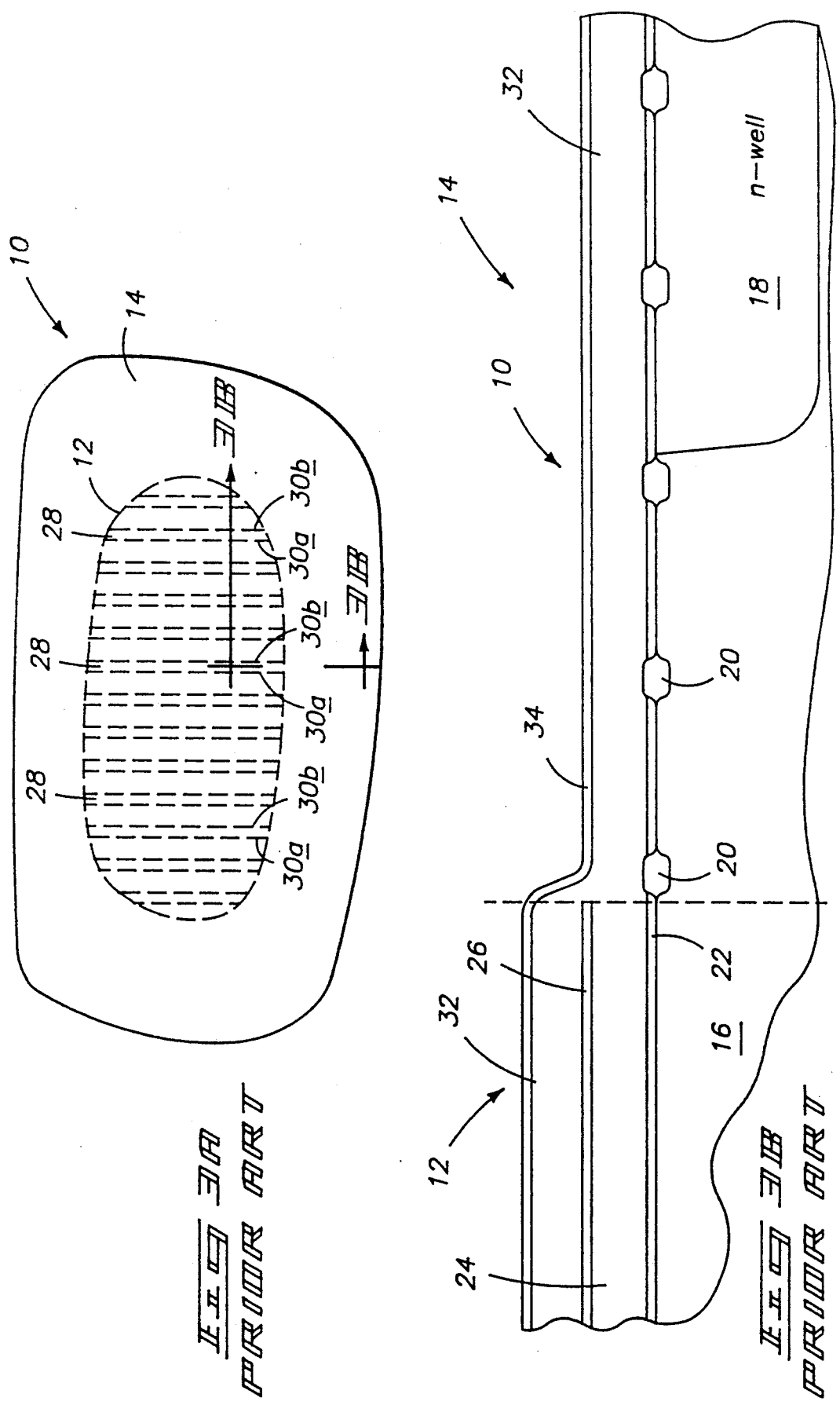
FIG. 3A is a top plan view of the FIG. 1A wafer fragment at a processing step subsequent to that illustrated by FIGS. 2A and 2B.
FIG. 3B is an enlarged cross sectional view of FIG. 3A taken through line 3B—3B in FIG. 3A.
Figures 4A, 4B:
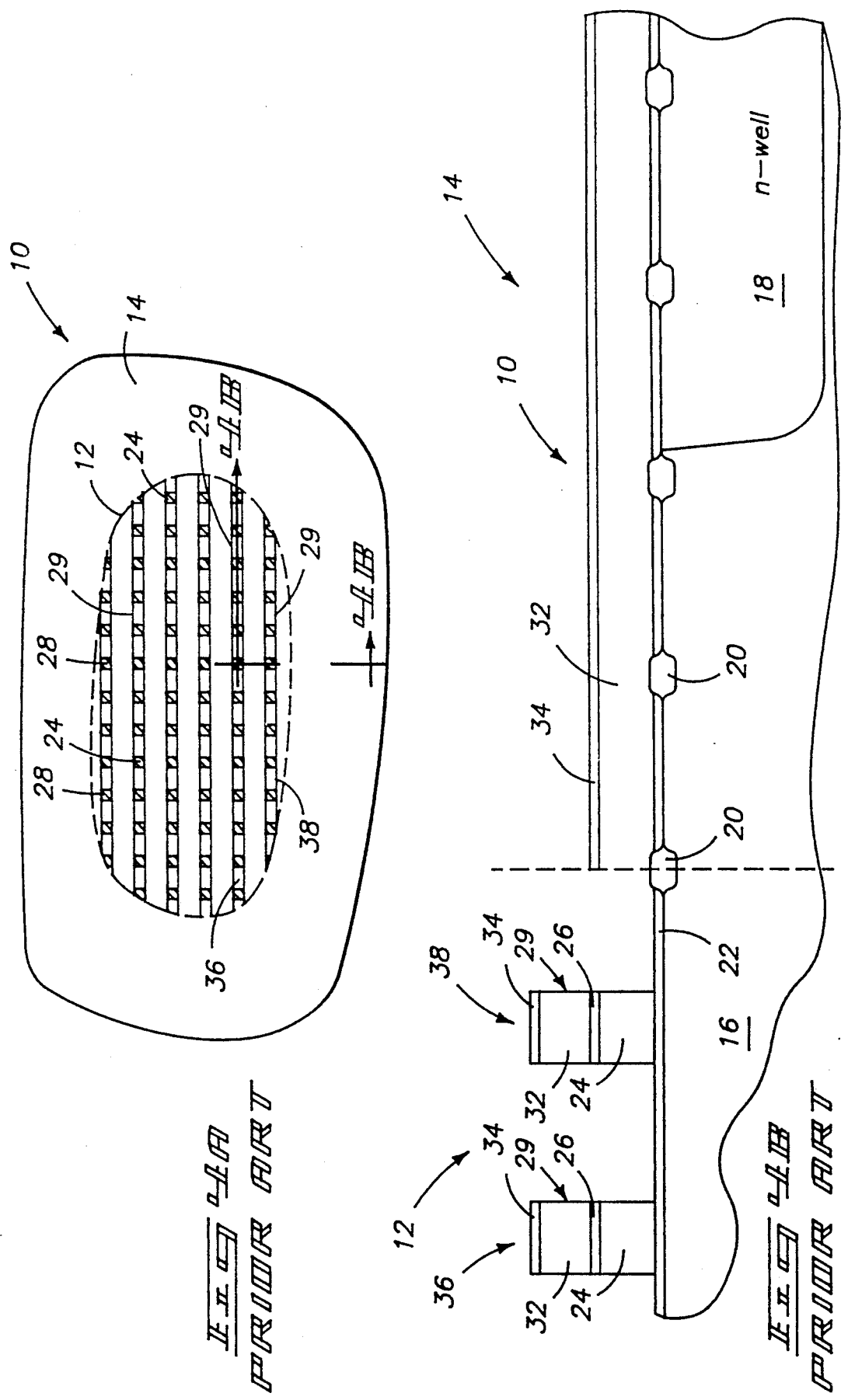
FIG. 4A is a top plan view of the FIG. 1A wafer fragment at a processing step subsequent to that illustrated by FIG. 3A.
FIG. 4B is an enlarged cross sectional view taken through line 4B—4B in FIG. 4A.
Figure 5:
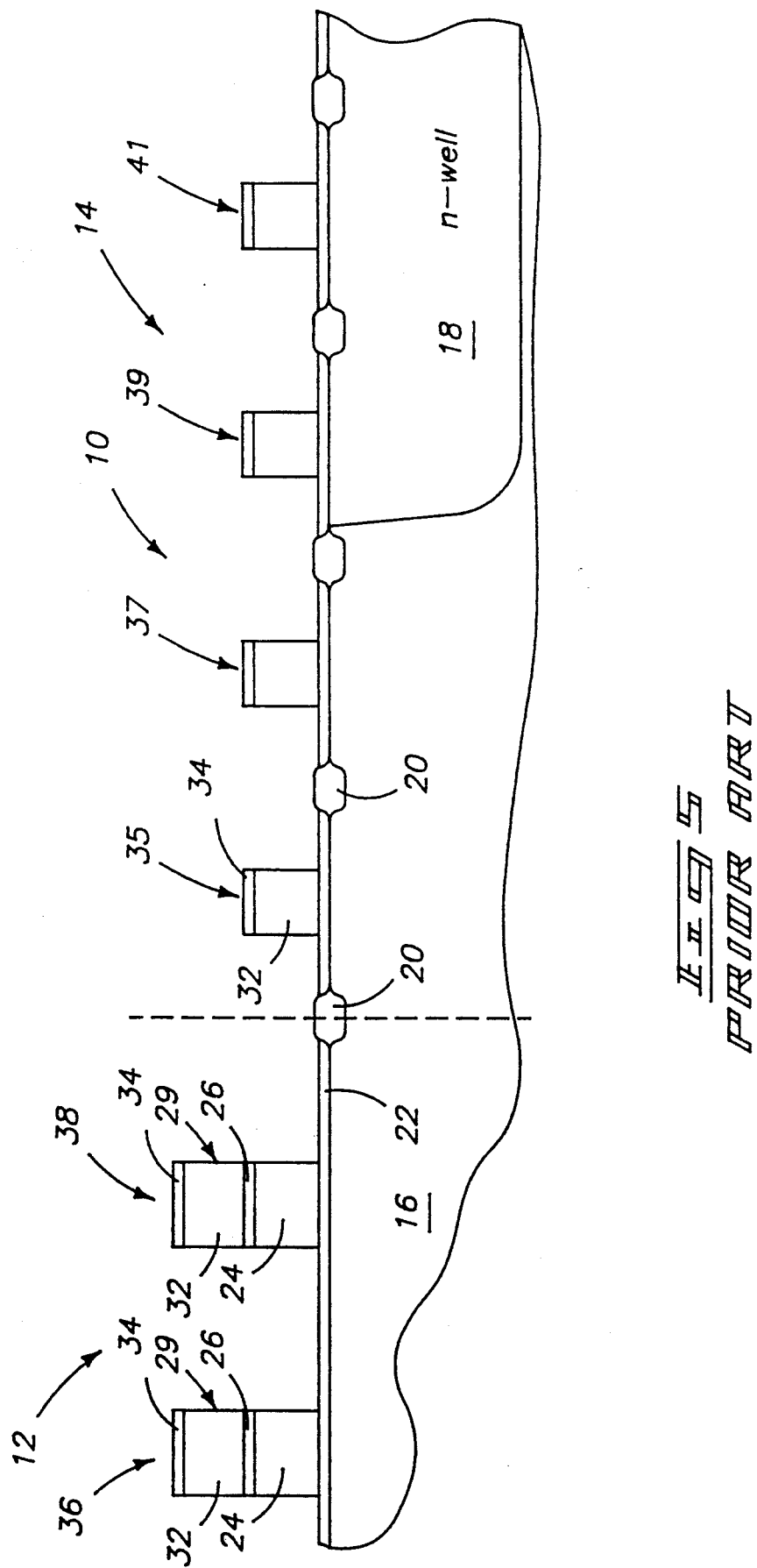
FIG. 5 is a cross sectional view of the FIG. 1A wafer corresponding in position to that of FIG. 1B, but taken at a processing step subsequent to that illustrated by FIG. 4B.
Figure 6:
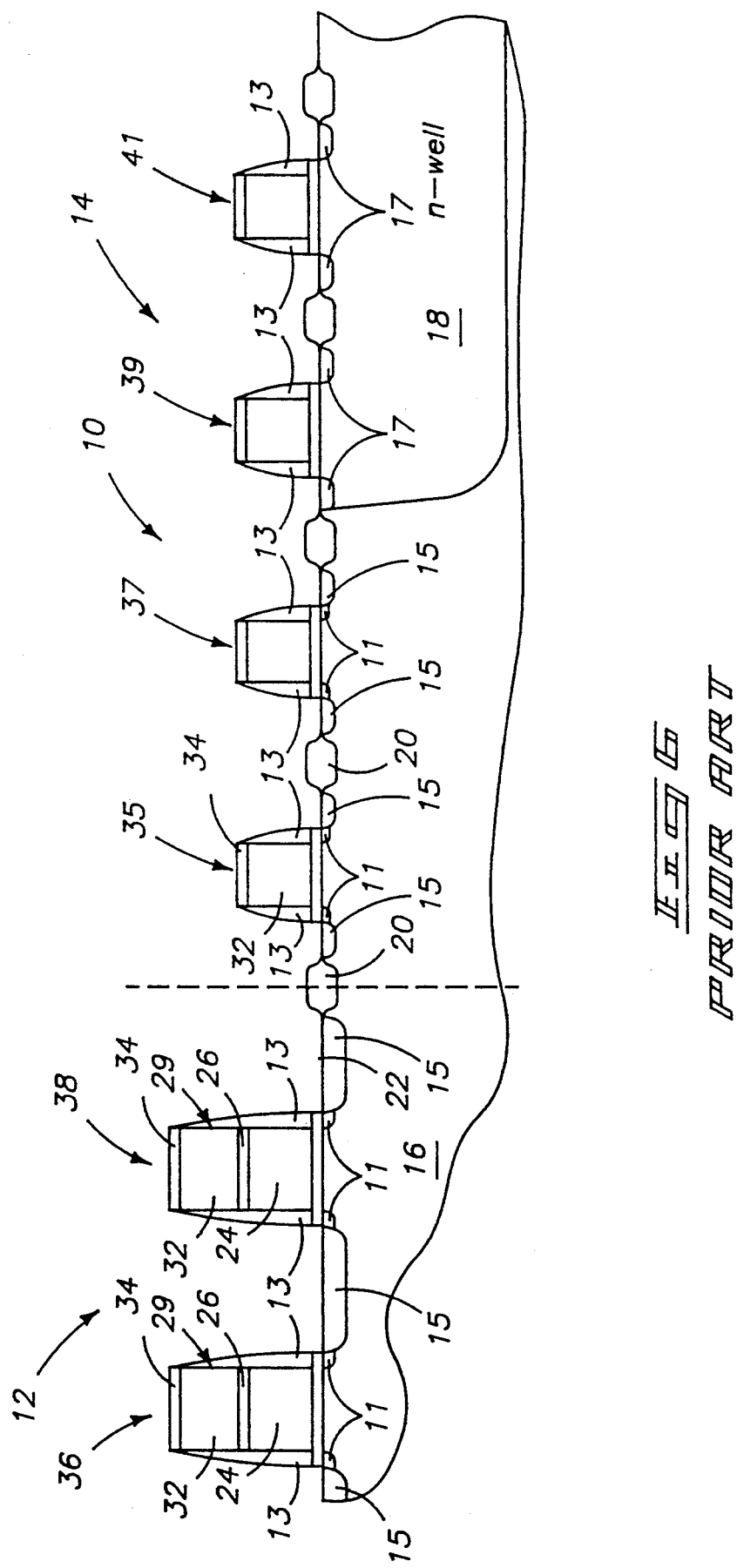
FIG. 6 is a cross sectional view of the FIG. 1A wafer corresponding in position to that of FIG. 1B, but taken at a processing step subsequent to that illustrated by FIG. 5B.

This disclosure of the invention is submitted in furtherance of the constitutional purposes of the U.S. Patent Laws "to promote the progress of science and useful arts" (Article 1, Section 8).

In accordance with one aspect of the invention, a process for fabricating a semiconductor wafer to form a memory array and peripheral area, where the array comprises nonvolatile memory devices employing floating gate transistors of a first conductivity type, comprises the following steps:

providing field and gate insulating layers on a semiconductor wafer, and defining an array area and an area peripheral to the array area for formation of first conductivity type nonvolatile memory devices in the array and formation of first and second conductivity type CMOS transistors in the peripheral area;

providing a first layer of conductive material atop the insulating layers;

providing a dielectric layer atop the first conductive layer for use in floating gate transistors within the array;

etching the dielectric layer and first conductive material from the peripheral area, and leaving dielectric layer and first conductive material in the array;

providing a second layer of conductive material atop the wafer which covers the peripheral area and dielectric layer of the array;

patterning and etching conductive and dielectric materials of the array separately from patterning and etching of conductive material of each of the first and second conductivity type CMOS transistors of the peripheral area;

patterning and etching conductive material of the first conductivity type CMOS transistors of the peripheral area separately from patterning and etching of each of, a) conductive and dielectric materials of the array, and b) conductive material of the second conductivity type CMOS transistors of the peripheral area; and patterning and etching conductive material of the second conductivity type CMOS transistors of the peripheral area separately from patterning and etching of each of, a) conductive and dielectric materials of the array, and b) conductive material of the first conductivity type CMOS transistors of the peripheral area.

The discussion of a preferred embodiment proceeds with reference to FIGS. 7–12. FIG. 7 illustrates a wafer at a processing step subsequent to that illustrated by FIGS. 4A and 4B of the prior art process described above in the "Background" section. Such wafer is designated in FIG. 7 and subsequent figures as wafer 10a. The remaining numerals in FIGS. 7–12 which are common to the FIGS. 1A–4B illustrations remain the same. Array area 12 is defined for formation of first conductivity type non-volatile memory devices in the array, with first and second conductivity type CMOS transistors to be formed in peripheral area 14. For purposes of the continuing discussion, the first and second conductivity type CMOS transistors will be formed in first and second peripheral areas 42, 44, respectively. Accordingly, peripheral area 14 can be considered as being divided into first and second peripheral areas 42 and 44.

With the array 12 having been patterned and etched, with polysilicon and WSi$_x$ layers 32 and 34 respectively covering peripheral area 14, an optional punch-through or other first doping is conducted into exposed areas of the array adjacent gate regions 36 and 38. Such produces halo regions 49 as shown. An example punch-through dopant would be boron implanted at a dose of $5 \times 10^{12}$ atoms/cm$^2$. During such doping, the second layer of conductive poly 32 in peripheral area 14 masks peripheral area 14 from implantation. WSi$_x$ layer 34 and poly layer 32 provide an effective mask of peripheral area 14 during such first doping, without requiring any use of photoresist. However, the halo implant 49 could be conducted before removing the mask used to product lines 36 and 38 while covering area 14. Note that the array area n-channel transistor implants at this point can or are optimized relative to what will be peripheral area n-channel transistors as a result of layers 34 and 32 masking peripheral area 14.

Figure 8B:
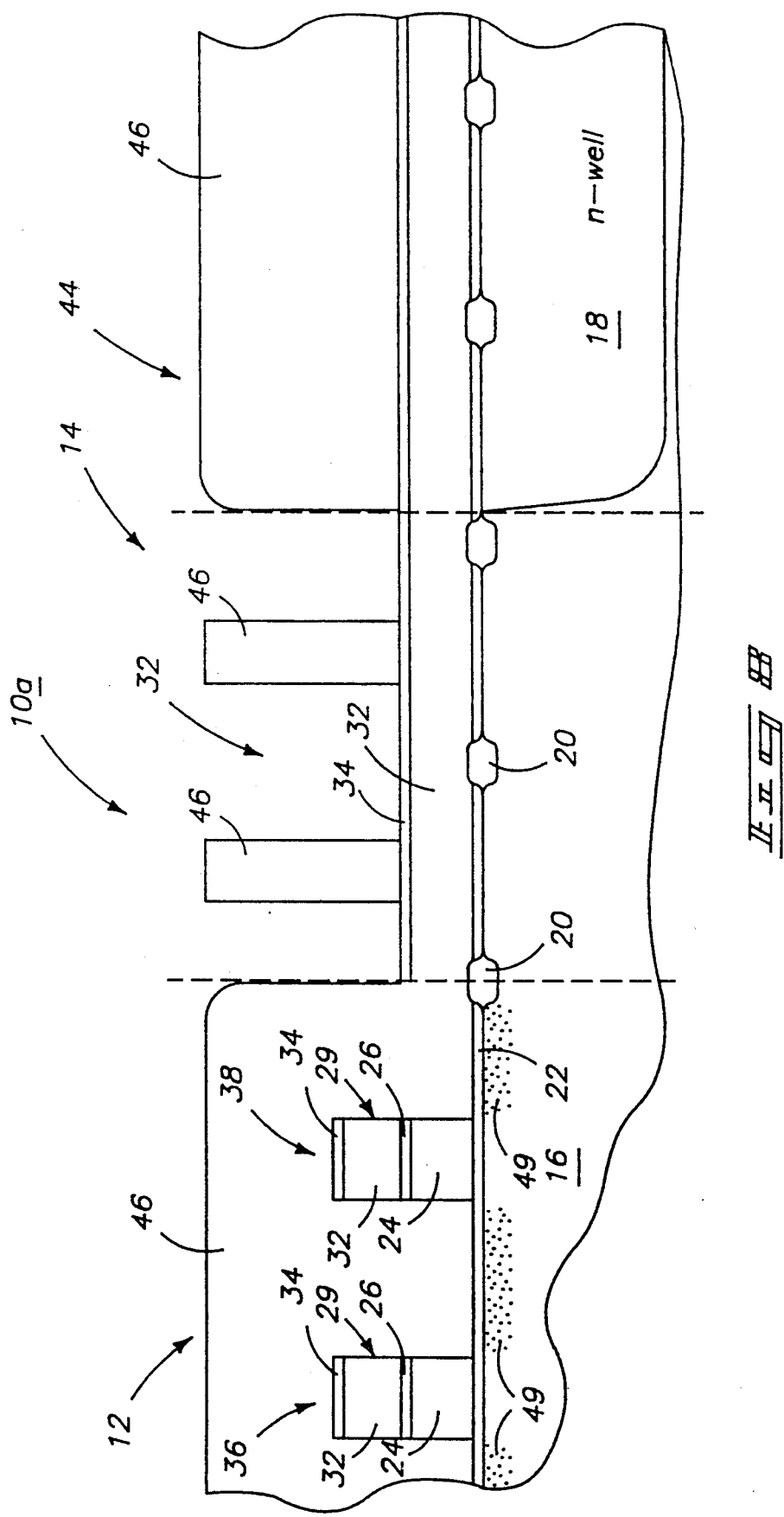
FIG. 8 is a cross sectional view of the FIG. 7 wafer at a processing step subsequent to that illustrated by FIG. 7.

Referring to FIG. 8, a layer of photoresist 46 is applied and patterned as shown to cover array 12 and second peripheral area 44, while defining regions for formation of MOS transistors within first peripheral area 42.

Referring to FIG. 9, the wafer is etched to form desired transistor gates 48, 50 in first peripheral area 42. Note that the peripheral area n-well transistors are not patterned and etched at this time, unlike the prior art. At this point, an optional punch-through or other doping can be conducted to produce halo or other regions 51 as shown. Polysilicon 32 and WSi$_x$ 34 in second peripheral area 44 mask the second peripheral area from such implantation along with overlying photoresist 46. Likewise, photoresist 46 masks array area 12. Note that the implant to produce regions 51 can be conducted independent of whether regions 49 are produced, and independent of the region 49 implant dosage.

Referring to FIG. 10, photoresist 46 has been removed and a thin 1000 Angstrom layer 61 of TEOS is applied to enable separation of a previously implanted boron halo and phosphorous to be implanted. The thickness of layer 61 in the figures is exaggerated for clarity. At this point, a first common doping of exposed areas of array 12 and first peripheral area 42 is conducted while second conductive layer 32 material masks second peripheral area 44 without the use of photoresist. The first common doping is conducted to form what will be LDD regions 63. A typical dose would be phosphorus at $5 \times 10^{13}$ atoms/cm$^2$. Regions 49 and 51 are no longer shown in FIG. 10 and subsequent figures for clarity.

Referring to FIG. 11, a layer of oxide is applied and anisotropically etched to form spacers 65 in combination with remaining material 61. Spacers 65 have a width at their base of approximately 2000 Angstroms to 4000 Angstroms. Layer 61 is not shown in FIG. 11 and subsequent figures for clarity. Thereafter, a heavy second common doping is conducted to form source and drain n+ regions 67 as shown. A typical dosage would be arsenic at $5 \times 10^{15}$ atoms/cm$^2$.

Figure 12:
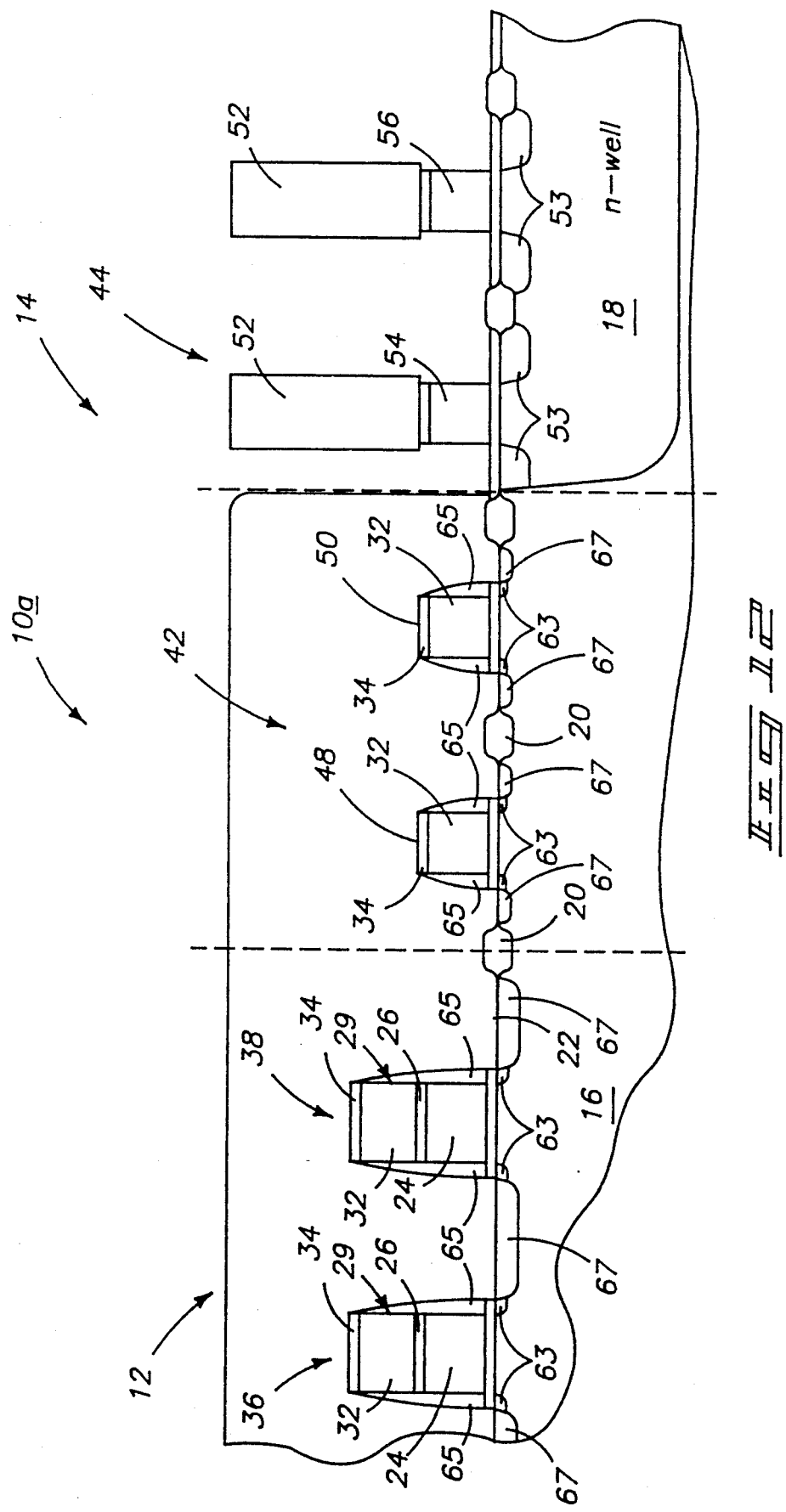
FIG. 12 is a cross sectional view of the FIG. 7 wafer at a processing step subsequent to that illustrated by FIG. 11.

Referring to FIG. 12, a layer 52 of photoresist is applied, patterned and etched as indicated to form second peripheral area transistors gates 54, 56 for second conductivity type CMOS transistors within n-well 18. The etch is conducted to produce a slight overhang of photoresist 52 relative to gates 54 and 56. With photoresist mask 52 in place, second conductivity type (p-type) implants (typically boron) are performed into n-well 18 to create p-channel active areas 53. The overhang spaces the implanted boron a desired distance from the gate. An example dosage would be boron at $5 \times 10^{15}$ atoms/cm$^2$. Photoresist layer 52 masks array 12 and first peripheral area 42 during such doping.

The described invention comprises a significant improvement over the prior art as such a CMOS process is now simplified and enables optimization of implants without additional process complexity. For example, the prior art requires six photomask steps as described above in the background. However in accordance with the above preferred embodiment, the number of photomasks has been reduced to three (that which produces FIGS. 7, followed by FIG. 8 and FIG. 12), and as well the n-channel implants of the array and periphery can be optimized relative to one another. With the prior art, optimization of such regions would require another photomask step, bringing the total to seven.

Memory cells of the array preferably comprise EPROM or EEPROM cells.

The above described preferred embodiment proceeded with the separate patterning of each of array region 12, first peripheral area 42, and second peripheral area 44 separately, with the array area being patterned and etched first, the first peripheral area 42 being patterned and etched second, and second peripheral area 44 being patterned and etched last. The sequencing with respect to such separate patterning and etching could of course be changed without departing from the principles and scope of the invention. For example, second peripheral area 44 could be masked and etched first, followed by the separate patterning and etching of first peripheral area 42, and finally array 12. Any ordering of the three regions could be separately patterned and etched in accordance with the invention, with patterning and etching of the array with the detailed described steps above being preferred. Regardless of the order, it is preferred that the array 12 and first peripheral area 42 be patterned in sequence, as the transistors to be formed utilize the same conductivity type impurity. This enables the alternate doping step of such regions, as described above, which dopes such regions with first conductivity type impurity during the same step.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A process for fabricating a semiconductor wafer to form a memory array and peripheral area, the array comprising nonvolatile memory devices employing floating gate transistors of a first conductivity type, the peripheral area comprising first and second conductivity type CMOS transistors, the method comprising the following steps:

providing field and gate insulating layers on a semiconductor wafer, and defining an array area and an area peripheral to the array area for formation of first conductivity type nonvolatile memory devices in the array and formation of first and second conductivity type CMOS transistors in the pheripheral area, the pheripheral area comprising first and second peripheral areas, the first and second conductivity type CMOS transistors to be formed in the first and second peripheral areas respectively;

providing a first layer of conductive material atop the insulating layers;

providing a dielectric layer atop the first conductive layer for use in floating gate transistors within the array;

etching the dielectric layer and first conductive material from the peripheral area, and leaving dielectric layer and first conductive material in the array;

after etching the dielectric layer and first conductive material from the peripheral area, providing a second layer of conductive material atop the wafer which covers the peripheral area and dielectric layer of the array;

patterning and etching the first conductive, second conductive and dielectric layers of the array and second conductive layer of the peripheral area to form gate regions of floating gate transistors in the array, and to cover the peripheral area;

patterning and etching the second conductive layer in the peripheral area to form transistor gates for the first conductivity type CMOS transistors in the first peripheral area, and to cover the second peripheral area;

after patterning and etching the array to form floating gate transistors and after patterning and etching the peripheral area to form transistor gates for the first conductivity type CMOS transistors, first doping exposed areas of only one of the array or first peripheral area while the second peripheral area and other of the array or first peripheral area are masked;

after the first doping, masking the second peripheral area with the second conductive layer without the use of photoresist and common doping exposed areas of the array and first peripheral area with first conductivity type material in the same step;

after patterning the array and first peripheral area, patterning and etching the second conductive layer in the second peripheral area to form transistor gates for the second conductivity type CMOS transistors in the second peripheral area; and after patterning and etching the second peripheral area, doping exposed areas of the second peripheral area with second conductivity type material while the array and first peripheral area are masked.

2. The process for fabricating a semiconductor wafer of claim 1 comprising patterning and etching the array to form the floating gate transistors before patterning and etching the first peripheral area to form the first conductivity type CMOS transistors, and wherein the first doping is conducted into exposed areas of the array.

3. The process for fabricating a semiconductor wafer of claim 1 comprising patterning and etching the first peripheral area to form the first conductivity type CMOS transistors before patterning and etching the array to form the floating gate transistors, and wherein the first doping is conducted into exposed areas of the first peripheral area.

4. The process for fabricating a semiconductor wafer of claim 1 wherein the recited conductive material is everywhere conductively doped polysilicon.

5. The process for fabricating a semiconductor wafer of claim 1 wherein the first conductivity type is "n" and the second conductivity type is "p".

6. The process for fabricating a semiconductor wafer of claim 1 wherein the recited conductive material is everywhere conductively doped polysilicon, and wherein the first conductivity type is "n" and the second conductivity type is "p".

7. The process for fabricating a semiconductor wafer of claim 1 further comprising conducting a second common doping of exposed areas of the array and first peripheral area with first conductivity type material in the same step while the second peripheral area is masked without the use of photoresist.

8. A process for fabricating a semiconductor wafer to form a memory array and peripheral area, the array comprising nonvolatile memory devices employing floating gate transistors of a first conductivity type, the peripheral area comprising first and second conductivity type CMOS transistors, the method comprising the following steps:

providing field and gate insulating layers on a semiconductor wafer, and defining an array area and an area peripheral to the array area for formation of first conductivity type nonvolatile memory devices in the array and formation of first and second conductivity type CMOS transistors in the peripheral area, the peripheral area comprising first and second peripheral areas, the first and second conductivity type CMOS transistors to be formed in the first and second peripheral areas respectively;

providing a first layer of conductive material atop the insulating layers;

providing a dielectric layer atop the first conductive layer for use in floating gate transistors within the array;

etching the dielectric layer and first conductive material from the peripheral area, and leaving dielectric layer and first conductive material in the array;

after etching the dielectric layer and first conductive material from the peripheral area, providing a second layer of conductive material atop the wafer which covers the peripheral area and dielectric layer of the array;

patterning and etching the first conductive, second conductive and dielectric layers of the array and second conductive layer of the peripheral area to form transistor gates for the peripheral second conductivity type CMOS transistors, and to cover the array and first peripheral area;

first doping exposed areas of the second peripheral area with second conductivity type material, the second layer of conductive material in the array and first peripheral area masking the array and first peripheral area from implantation during the first doping;

after doping the second peripheral area, patterning and etching the second conductive layer in the first peripheral area to form transistor gates for the first conductivity type CMOS transistors in the first peripheral area, and to cover the array;

after doping the second peripheral area, patterning and etching the first conductive, second conductive and dielectric layers of the array to form gate regions of floating transistors;

after doping the second peripheral area and after patterning and etching only one of the array or first peripheral area, second doping exposed areas of the one of the array or first peripheral area with first conductivity type material while the second peripheral area and other of the array or first peripheral area are masked, the other of the array or first peripheral area being masked by unpatterned second conductive layer without the use of photoresist during such second doping: and after the first and second dopings, common doping exposed areas of the array and first peripheral area with first conductivity type material in the same step while the second peripheral area is masked.

9. The process for fabricating a semiconductor wafer of claim 8 comprising patterning and etching the array to form the floating gate transistors before patterning and etching the first peripheral area to form the first conductivity type CMOS transistors, and wherein the first doping is conducted into exposed areas of the array.

10. The process for fabricating a semiconductor wafer of claim 8 comprising patterning and etching the first peripheral area to form the first conductivity type CMOS transistors before patterning and etching the array to form the floating gate transistors, and wherein the first doping is conducted into exposed areas of the first peripheral area.

11. The process for fabricating a semiconductor wafer of claim 8 wherein the recited conductive material is everywhere conductively doped polysilicon.

12. The process for fabricating a semiconductor wafer of claim 8 wherein the first conductivity type is "n" and the second conductivity type is "p".

13. The process for fabricating a semiconductor wafer of claim 8 wherein the recited conductive material is everywhere conductively doped polysilicon, and wherein the first conductivity type is "n" and the second conductivity type is "p".

14. The process for fabricating a semiconductor wafer of claim 8 further comprising conducting a second common doping of exposed areas of the array and first peripheral area with first conductivity type material in the same step while the second peripheral area is masked without the use of photoresist.

15. A process for fabricating a semiconductor wafer to form a memory array and peripheral area, the array comprising nonvolatile memory devices employing floating gate transistors of a first conductivity type, the peripheral area comprising first and second conductivity type CMOS transistors, the method comprising the following steps:

providing field and gate insulating layers on a semiconductor wafer, and defining an array area and an area peripheral to the array area for formation of first conductivity type nonvolatile memory devices in the array and formation of first and second conductivity type CMOS transistors in the peripheral area, the peripheral area comprising first and second peripheral areas, the first and second conductivity type CMOS transistors to be formed in the first and second peripheral areas respectively;

providing a first layer of conductive material atop the insulating layers;

providing a dielectric layer atop the first conductive layer for use in floating gate transistors within the array;

etching the dielectric layer and first conductive material from the peripheral area, and leaving dielectric layer and first conductive material in the array;

after etching the dielectric layer and first conductive material from the peripheral area, providing a second layer of conductive material atop the wafer which covers the peripheral area and dielectric layer of the array;

patterning and etching the first conductive, second conductive and dielectric layers of the array and second conductive layer of the peripheral area to form gate regions of floating gate transistors in the array, and to cover the peripheral area;

patterning and etching the second conductive layer in the peripheral area to form transistor gates for the first conductivity type CMOS transistors in the first peripheral area, and to cover the second peripheral area;

after patterning and etching the array to form floating gate transistors and after patterning and etching the peripheral area to form transistor gates for the first conductivity type CMOS transistors, masking the second peripheral area with the second conductive layer without the use of photoresist and common doping exposed areas of the array and first peripheral area with first conductivity type material in the same step;

after patterning the array and first peripheral area, patterning and etching the second conductive layer in the second peripheral area to form transistor gates for the second conductivity type CMOS transistors in the second peripheral area; and after patterning and etching the second peripheral area, doping exposed areas of the second peripheral area with second conductivity type material while the array and first peripheral area are masked.

16. The process for fabricating a semiconductor wafer of claim 15 comprising patterning and etching the array to form the floating gate transistors before patterning and etching the first peripheral area to form the first conductivity type CMOS transistors.

17. The process for fabricating a semiconductor wafer of claim 15 comprising patterning and etching the first peripheral area to form the first conductivity type CMOS transistors before patterning and etching the array to form the floating gate transistors.

18. The process for fabricating a semiconductor wafer of claim 15 wherein the recited conductive material is everywhere conductively doped polysilicon.

19. The process for fabricating a semiconductor wafer of claim 15 wherein the first conductivity type is "n" and the second conductivity type is "p".

20. The process for fabricating a semiconductor wafer of claim 15 wherein the recited conductive material is everywhere conductively doped polysilicon, and wherein the first conductivity type is "n" and the second conductivity type is "p".

21. The process for fabricating a semiconductor wafer of claim 15 further comprising conducting a second common doping of exposed areas of the array and first peripheral area with first conductivity type material in the same step while the second peripheral area is masked without the use of photoresist.

22. A process for fabricating a semiconductor wafer to form a memory array and peripheral area, the array comprising nonvolatile memory devices employing floating gate transistors of a first conductivity type, the peripheral area comprising first and second conductivity type CMOS transistors, the method comprising the following steps:

providing field and gate insulating layers on a semiconductor wafer, and defining an array area and an area peripheral to the array area for formation of first conductivity type nonvolatile memory devices in the array and formation of first and second conductivity type CMOS transistors in the peripheral area, the peripheral area comprising first and second peripheral areas, the first and second conductivity type CMOS transistors to be formed in the first and second peripheral areas respectively;

providing a first layer of conductive material atop the insulating layers;

providing a dielectric layer atop the first conductive layer for use in floating gate transistors within the array;

etching the dielectric layer and first conductive material from the peripheral area, and leaving dielectric layer and first conductive material in the array;

after etching the dielectric layer and first conductive material from the peripheral area, providing a second layer of conductive material atop the wafer which covers the peripheral area and dielectric layer of the array;

patterning and etching the first conductive, second conductive and dielectric layers of the array and second conductive layer of the peripheral area to form transistor gates for the peripheral second conductivity type CMOS transistors, and to cover the array and first peripheral area;

doping exposed areas of the second peripheral area with second conductivity type material, the second layer of conductive material in the array and first peripheral area masking the array and first peripheral area from implantation during the doping;

after doping the second peripheral area, patterning and etching the second conductive layer in the peripheral area to form transistor gates for the first conductivity type CMOS transistors in the first peripheral area, and to cover the array;

after doping the second peripheral area, patterning and etching the first conductive, second conductive and dielectric layers of the array to form gate regions of floating transistors; and common doping exposed areas of the array and first peripheral area with first conductivity type material in the same step while the second peripheral area is masked.

23. The process for fabricating a semiconductor wafer of claim 22 comprising patterning and etching the array to form the floating gate transistors before patterning and etching the first peripheral area to form the first conductivity type CMOS transistors.

24. The process for fabricating a semiconductor wafer of claim 22 comprising patterning and etching the first peripheral area to form the first conductivity type CMOS transistors before patterning and etching the array to form the floating gate transistors.

25. The process for fabricating a semiconductor wafer of claim 22 wherein the recited conductive material is everywhere conductively doped polysilicon.

26. The process for fabricating a semiconductor wafer of claim 22 wherein the first conductivity type is "n" and the second conductivity type is "p".

27. The process for fabricating a semiconductor wafer of claim 22 wherein the recited conductive material is everywhere conductively doped polysilicon, and wherein the first conductivity type is "n" and the second conductivity type is "p".

28. The process for fabricating a semiconductor wafer of claim 22 further comprising conducting a second common doping of exposed areas of the array and first peripheral area with first conductivity type material in the same step while the second peripheral area is masked without the use of photoresist.

* * * * *